United States Patent [19]

Kitamura et al.

[11] Patent Number: 4,626,827

[45] Date of Patent: Dec. 2, 1986

[54] METHOD AND SYSTEM FOR DATA COMPRESSION BY VARIABLE FREQUENCY SAMPLING

[75] Inventors: Masatsugu Kitamura, Atsugi; Mitsuaki Tanaka, Fujisawa; Hiroyuki Takekura, Sagamihara, all of Japan

[73] Assignee: Victor Company of Japan, Limited, Japan

[21] Appl. No.: 475,405

[22] Filed: Mar. 15, 1983

[30] Foreign Application Priority Data

| Mar. 16, 1982 | [JP] | Japan | 57-41550 |
| Mar. 18, 1982 | [JP] | Japan | 57-43649 |
| Mar. 24, 1982 | [JP] | Japan | 58-46575 |
| Mar. 26, 1982 | [JP] | Japan | 57-48254 |

[51] Int. Cl.⁴ ............................................. H03K 13/02
[52] U.S. Cl. ...................... 340/347 SH; 340/347 AD; 340/347 DA; 340/347 M; 358/138; 364/179; 364/572; 364/576; 364/726; 381/31
[58] Field of Search ................ 340/347 AD, 347 SH, 340/347 DA, 347 R, 347 M; 367/31; 364/576, 726; 324/77 R, 77 A, 77 B; 328/151; 381/29-32, 51

[56] References Cited

U.S. PATENT DOCUMENTS

| 3,324,237 | 6/1967 | Cherry et al. | 358/138 |
| 3,383,461 | 5/1968 | Dryden | 358/138 |
| 4,213,134 | 7/1980 | Chen | 364/483 X |
| 4,366,471 | 12/1982 | Kasuga | 364/572 X |
| 4,388,611 | 6/1983 | Haferd | 340/347 SH |
| 4,393,371 | 7/1983 | Morgan-Smith | 340/347 SH X |

FOREIGN PATENT DOCUMENTS 0043652 1/1982 European Pat. Off. .
1011567 12/1965 United Kingdom .
1350102 4/1974 United Kingdom .

OTHER PUBLICATIONS

Fjallbrant, Method of Data Reduction of Sampled Speech Signals..., Electronics Letters, 5/1977, vol. 13, No. 11, pp. 334 & 335.
Proceedings on the IEEE, vol. 55, No. 3, Mar. 1967, pp. 253–263, New York, US; C. M. Kortman: "Redundancy Reduction, a Practical Method of Data Compression'-'-p. 254, col. 1, lines 17–22, p. 259, line 11–p. 258, col. 1, line 43; Figures 12–13.
Electronics Letters 13 (1977), No. 11, May 26th, pp. 334, 335.
*Introduction to Pascal*, Jim Walsh et al, Prentice-Hall International Series in Computer Science, 1979.
*Digital Signal Processing*, Abraham Peled et al, John Wiley & Sons, Inc., 1976.

Primary Examiner—T. J. Sloyan
Attorney, Agent, or Firm—Lowe, Price, LeBlanc, Becker & Shur

[57] ABSTRACT

A data compression system comprises an analog-to-digital converter for quantizing the analog signal at a first sampling frequency into a series of digital samples and a memory for storing the digital samples. A control circuit generates a sampling datum indicating a variable sampling frequency lower than the first sampling frequency as a function of the instantaneous frequency of the analog signal for selecting digital samples from the memory, reads the selected digital samples out of the memory means in response to the sampling datum, and forms the sampling datum and the selected digital samples into a data set. A series of data sets may be transmitted to a receiving end of the system or stored in a recording medium. The sampling datum is used to indicate the point at which the digital sample is converted to a corresponding analog value.

23 Claims, 15 Drawing Figures

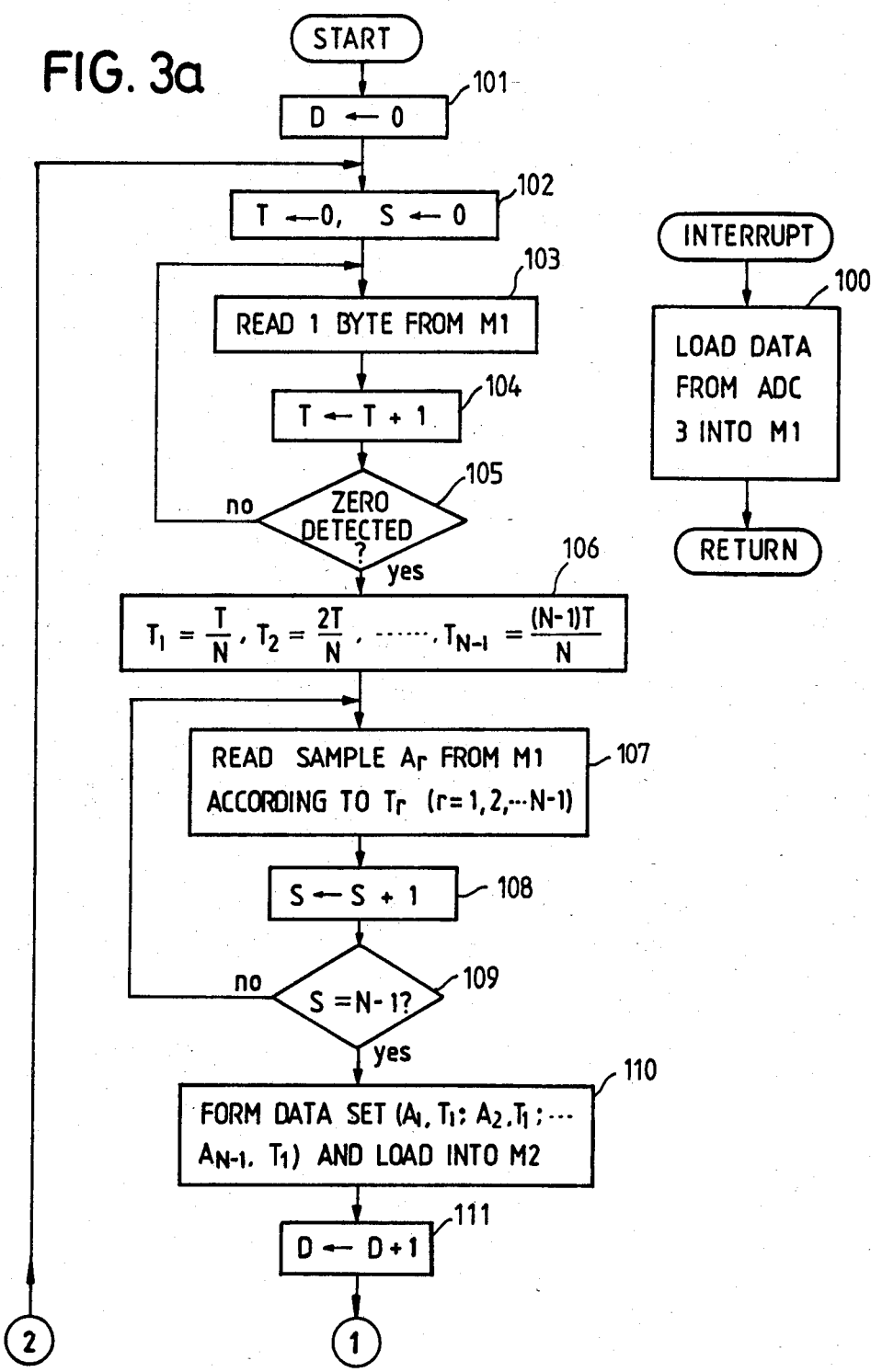

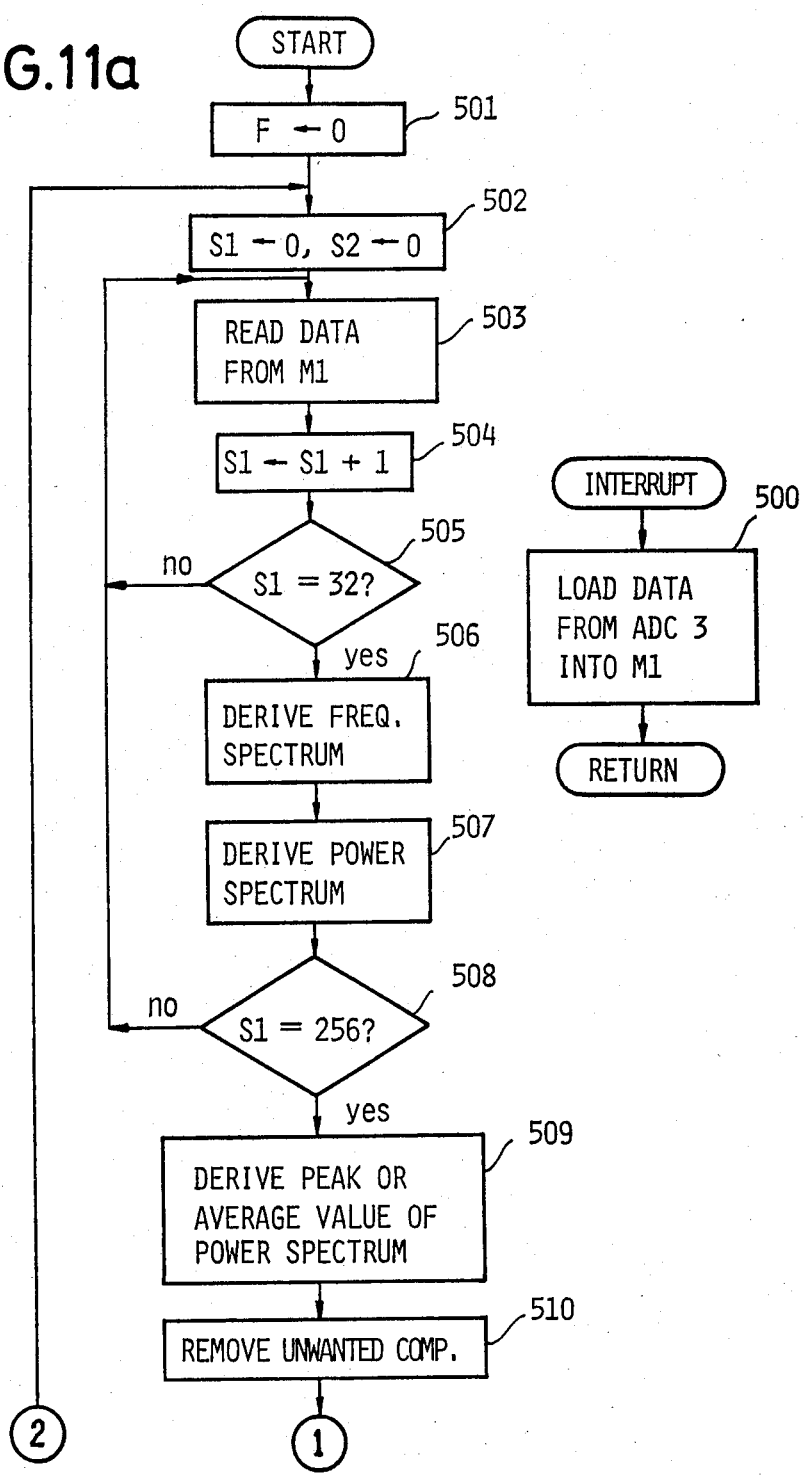

METHOD AND SYSTEM FOR DATA COMPRESSION BY VARIABLE FREQUENCY SAMPLING

BACKGROUND OF THE INVENTION

The present invention relates generally to data compression techniques, and more particularly to a method and system for translating an analog signal into a series of binary coded digital samples.

Many attempts have hitherto been made to reduce the amount of information to be stored in a recording medium or transmitted over telephone lines to a distant end. The known data compression technique includes a method whereby the amplitude of analog signals is logarithmically compressed, and a method known as delta modulation in which the differential component of the analog signal is detected for transmission and the signal is integrated for recovery at the receiving end. In either of these known methods, the analog signal is sampled at a constant frequency which is at least twice the highest frequency of the analog signal to prevent foldover distortion. However, due to the constant sampling frequency quantum noise occurs in the known data compression system over the bandwidth of the recovered signal.

According to a data compression system, as shown and described in U.S. Pat. No. 4,370,643 issued to M. Kitamura and assigned to the same assignee as the present invention, the sampling interval is determined by the amount of deviation of the original signal from the previously sampled analog value so that the deviation is smaller than a predetermined value of the ratio of the original to the sampled value. While this data compression system is satisfactory under certain circumstances, a disadvantage is that details of the original waveform are not satisfactorily recovered.

SUMMARY OF THE INVENTION

It is therefore an object of the present invention to provide data compression by variable frequency sampling to ensure the reconstruction of the detail of the original waveform while eliminating quantum noise.

According to a first aspect of the invention, a method is provided for translating an analog signal into a digital signal. The method comprises generating a sampling datum indicating a sampling interval variable inversely as a function of the instantaneous frequency of the analog signal, sampling the analog signal at the variable sampling interval to generate a digital sample of a binary code representing the magnitude of the sampled analog signal, and forming the sampling datum and the digital sample into a data set.

According to a second aspect of the invention, a system is provided for translating an analog signal into a series of digital samples. The system comprises means for sampling the analog signal at a first sampling frequency and generating therefrom a series of digital samples, and a memory means for storing the digital samples. A control means is provided for generating a sampling datum indicating a variable sampling frequency lower than the first sampling frequency as a function of the instantaneous frequency of the analog signal for selecting digital samples from the memory means, reading the selected digital samples out of the memory means in response to the sampling datum, and forming the sampling datum and the selected digital samples into a data set.

Since the sampling interval is inversely variable as the instantaneous frequency of the analog signal, the original waveform can be reconstructed to fine details.

The data set may be stored in a memory or transmitted, and upon reconstruction, the sampling datum is used to indicate the interval at which the digital sample is reconverted to an analog value.

BRIEF DESCRIPTION OF THE DRAWINGS

The present invention will be described in further detail with reference to the accompanying drawings, in which:

FIGS. 3a and 3b are a flowchart describing the steps of instructions of the first embodiment executed by the microcomputer of FIG. 1 when the system is operating in a recording mode;

FIGS. 11a and 11b are a flowchart of the microcomputer according to a modified form of the second embodiment.

DETAILED DESCRIPTION

Figure 1:
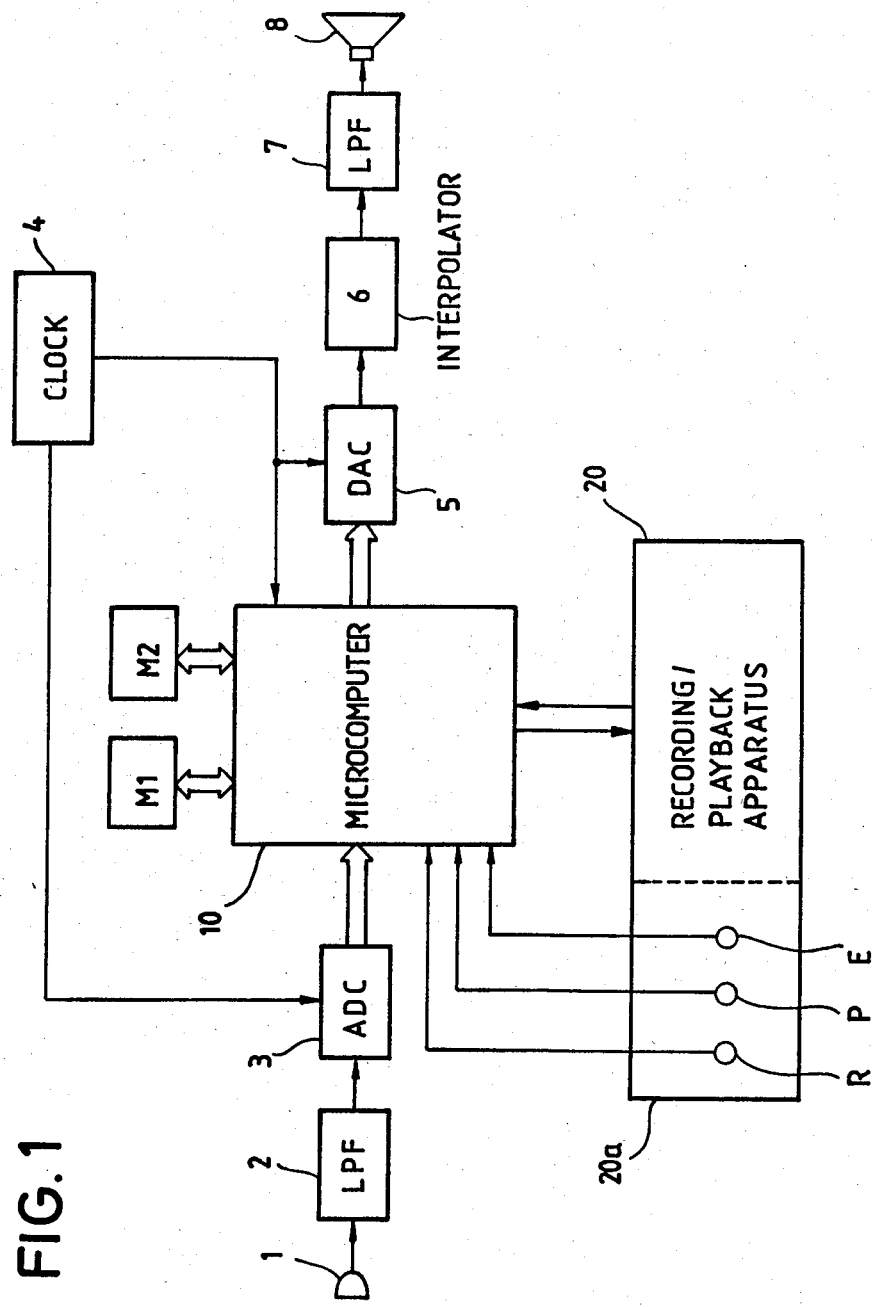
FIG. 1 is a block diagram of a data compression system according to a first embodiment of the invention.

Referring now to FIG. 1, there is shown a data reduction system constructed according to a first embodiment of the present invention. The data reduction system generally comprises a microcomputer 10 and a recording-playback apparatus 20. The apparatus 20 may comprise a tape recording-playback section and a control board 20a having manual controls by which command signals are fed to the microcomputer 10.

Figure 2:
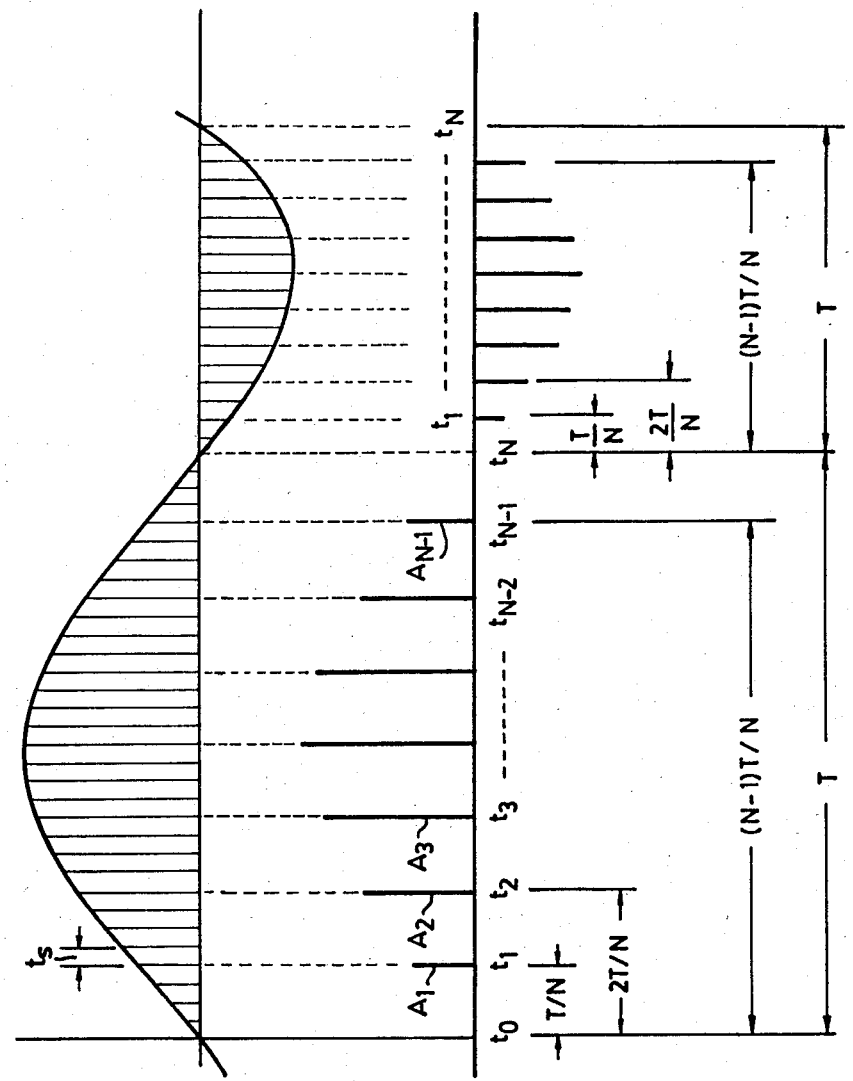
FIG. 2 is a waveform diagram useful for describing the operation of the first embodiment.

A voice signal from a microphone 1 or any other source is applied to a low-pass filter 2 where the frequencies higher than 4000 Hz are suppressed. The output of the low-pass filter 2 is fed to an analog-to-digital converter or PCM encoder 3 which is synchronized with a clock supplied from a time base 4 which forms part of the microcomputer 10. The AD converter 3 samples the signal at intervals $t_s$, FIG. 2, or at a frequency of 8000 Hz and converts the sampled value into a digital sample of an 8-bit code. As will be detailed hereinbelow, the microcomputer 10 is programmed to receive the digitized signal at clock intervals and load it into a buffer memory M1 having a memory capacity of 512 bytes which forms part of the microcomputer and samples the stored digitized signal at longer intervals than $t_s$ determined by the programmed instructions for transfer to a read-write memory M2 to reduce the quantity of the data bits to be supplied to the recording-playback apparatus or external memory 20. The read-write memory M2 having a capacity of 64 kilobytes stores the sampled digital signals prior to further transfer to the apparatus 20.

During playback modes, a digital signal from the apparatus 20 is fed to the read-write memory M2 at clock intervals and thence to a digital-to-analog converter or PCM decoder 5 which is clocked by the time base 4. The output of the DA converter 5 is an analog representation of the data sample and coupled to an interpolator 6. The interpolator 6 provides interpolation between successive analog samples. The interpolated analog signal is further processed by a low-pass filter 7 and delivered to a loudspeaker 8.

The control board includes switches R, P and E. The switch R is operated to initiate recording operation, the switch P is used to initiate playback operation, and the switch E to terminate either of the recording and playback operations. When switch R is operated, clock is supplied to the AD converter 3 and the microcomputer 10 initiates the programmed instructions.

Figure 3B:
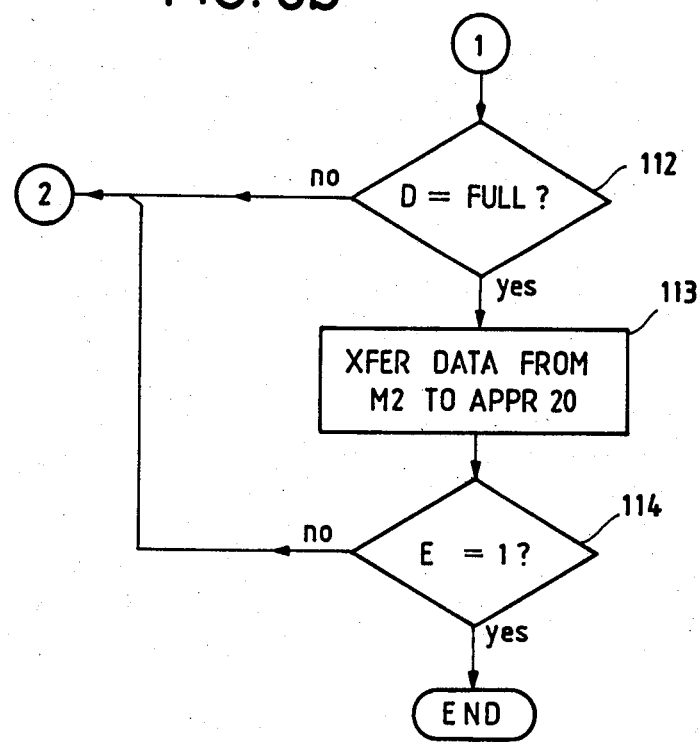

According to a first embodiment of the invention, the microcomputer 10 is programmed to perform the steps as described in various blocks of FIGS. 3a and 3b. These steps are interrupted at periodic clock intervals by an interrupt subroutine 100 to read digital samples from the AD converter 3 into the buffer memory M1. The program begins with a block 101 when the switch R is operated by resetting a data set counter D. In block 102, an 8-bit zero-crosspoint interval counter T and a sampling counter S of the microcomputer 10 are reset to zero. The zero-crossing interval counter T is used to measure the interval between successive zero crossover points of the input analog signal. A digital sample is read from the 512-byte buffer memory M1 in block 103. The counter T is incremented by "1" in response to the reading of each digital sample from the memory M1, block 104. The zero crossing interval T is measured by a program loop formed by block 105 in which the digital sample just read from memory M1 is checked to see if there is a change in sign bit indicating the occurrence of a zero crosspoint and if not, the program returns to block 103 to read the next digital sample from the memory M1, further incrementing the counter T. This process is continued until a zero crosspoint is detected in block 105. The program now enters a block 106 to determine sampling points for transferring digital samples $A_1, A_2, \ldots A_{N-1}$ from memory M1 to memory M2. In block 106 the count value T, which is representative of the zero crossing interval from time $t_0$ to $t_N$ (see FIG. 2), is divided into N segments (where N is an integer greater than unity) and multiplied by integers from 1 to (N−1) to generate a series of sampling data $T_1 (=T/N)$, $T_2 (=2T/N), \ldots T_{N-1} (=(N-1)T/N)$.

A digital sample having an analog value $A_r (r=1, 2, \ldots N-1)$ is addressed by a corresponding sampling data $T_r$ and read out of memory M1 as stated in block 107. The sampling counter S is incremented by "1" in block 108 and its count value is checked in block 109 if it corresponds to N−1, and if not, the program returns to block 107 to read the next digital sample $A_{r+1}$. This process is repeated until digital samples $A_1$ to $A_{N-1}$ are read out of memory M1. These digital samples and the sampling code $T_1$ are paired to form data sets $(A_1, T_1; A_2, T_2; \ldots A_{N-1}, T_1)$ and loaded into the read-write memory M2, block 110. The 15-bit data set counter D is incremented by "1" in block 111 in response to the loading of each data set to count the total number of data sets stored in memory M2. It is seen that there is a predetermined constant number of digital samples for each of the zero crossing intervals T while the latter interval may vary from instant to instant and the number of samples transferred to memory M2 is much smaller than the total number of digital samples stored in memory M1.

The data set counter D is checked in block 112 to see if it is filled to a full count, and if not, the program returns to block 103 to read the next 1-byte from the memory M1. When full count is reached in the counter D, all the data stored in memory M2 is transferred to the external memory 20 (block 113). The recording mode is terminated by operating a stop switch E, this condition being detected in block 114.

Playback mode is initiated by operation of a switch P on the control board 20a. When this occurs, the program shown in FIG. 4a begins with a block 201 in which the data-set counter D is reset to zero. The apparatus 20 is clocked to transfer the recorded data sets $A_r$ and $T_r$ from the storage medium to the read-write memory M2 at the same rate as they are recorded. This is done by an interrupt routine 200.

The digital samples and corresponding sampling data, now loaded into the memory M2, are addressed sequentially and transferred to the DA converters DAC1 and DAC2, (shown in FIG. 5) respectively, by having the microcomputer 10 execute blocks 202 to 206. In block 202, the sampling counter S is reset to zero. A digital sample $A_r$ is read from memory M2 and an amplitude difference $\Delta A_r$ between $A_{r+1}$ and $A_r$ is obtained and transferred to DA converter DAC1 (block 203). Sampling code $T_1$ is transferred from memory M2 to DA converter DAC2. The sampling counter S is incremented by "1" in block 205. The counter S is checked in block 206 to see if it is filled to an N−1 count. Blocks 203 to 206 are repeated until S becomes equal to N−1. When this occurs, the program exits to a block 207 to increment the data set counter D by "1" and if not, it returns to block 203 to repeat the above process until S-N−1 is reached.

Figure 5:
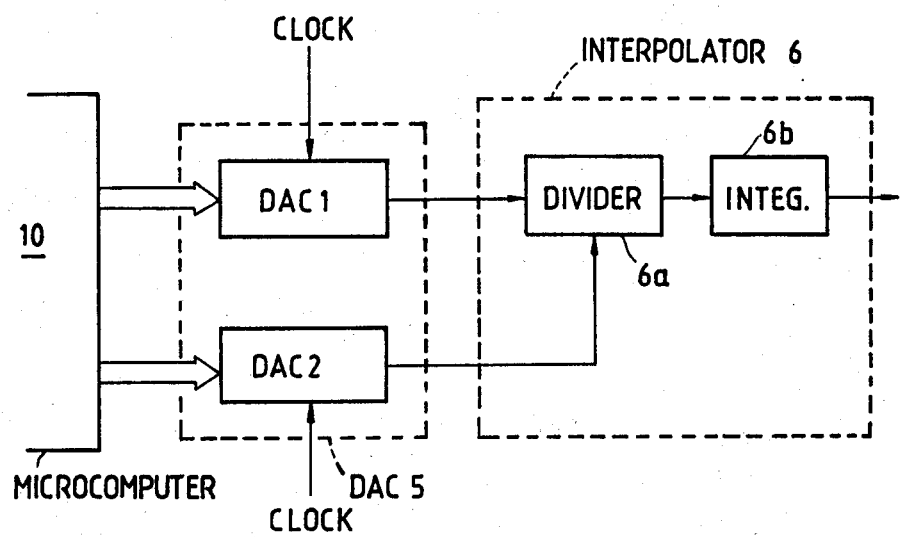
FIG. 5 is a block diagram showing the detail of the digital-to-analog converter and interpolator of FIG. 1.

In order to decode the data now retrieved from the memory M2, reference is made to FIG. 5 in which the detail of the decoder of the first embodiment is illustrated. The DA converter 5 comprises a first DA converter section DAC1 and a second converter section DAC2 which are respectively arranged to receive differential amplitude and time data $(\Delta A_r, Tr)$ from the microcomputer 10 to convert them to corresponding analog values. The interpolator 6 comprises a divider 6a which receives the analog values of the amplitude and time data from DAC1 and DAC2, and an integrator 6b coupled to the output of the divider 6a.

Figure 6:
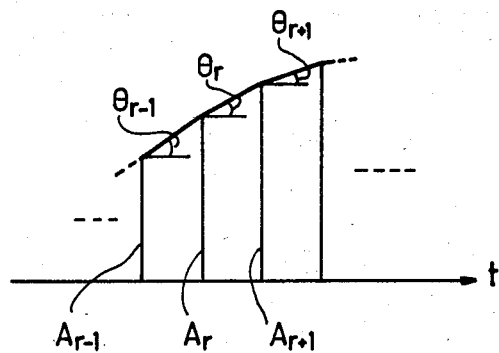
FIG. 6 is a waveform diagram associated with the first embodiment.

The amplitude signal $\Delta A_r$ is divided by the time signal $T_1$ in the divider 6a to provide a quotient Xr which represents the gradient $\theta r$ to provide interpolation between successive sample points. The integrator 6b provides time integration of this quotient signal to generate a signal Yr $(= \int Xi\, dt)$ so that the slope of its waveform is proportional to the gradient $\theta r$ and varies from one sampling point to another as illustrated in FIG. 6. Therefore, the output of the interpolator 6 is an envelope of successively interconnected line segments which approximate the waveform of the original analog signal.

Through the filtering action of the low-pass filter 7 undesirable high frequency components of the signal from the interpolator are eliminated before it is applied to the loudspeaker 8.

Returning to FIG. 4a, a delay time is introduced in block 208 to permit the converter 5 and interpolator 6 to process their input signals in a manner just described before the next data set is read out of the memory M2.

The microcomputer checks the data set counter D in block 209 to see if it is filled to a full count and if not, advances to a block 210 to check if stop switch E is operated. The program exits from block 210 to block 202 to repeat the above process to reproduce the digital samples contained in the next data set.

It is seen therefore that there is a substantial reduction in data quantity. The external memory system 20 may be dispensed with if the capacity of the internal memory M2 is sufficient to store the information.

Figures 4A, 4B:
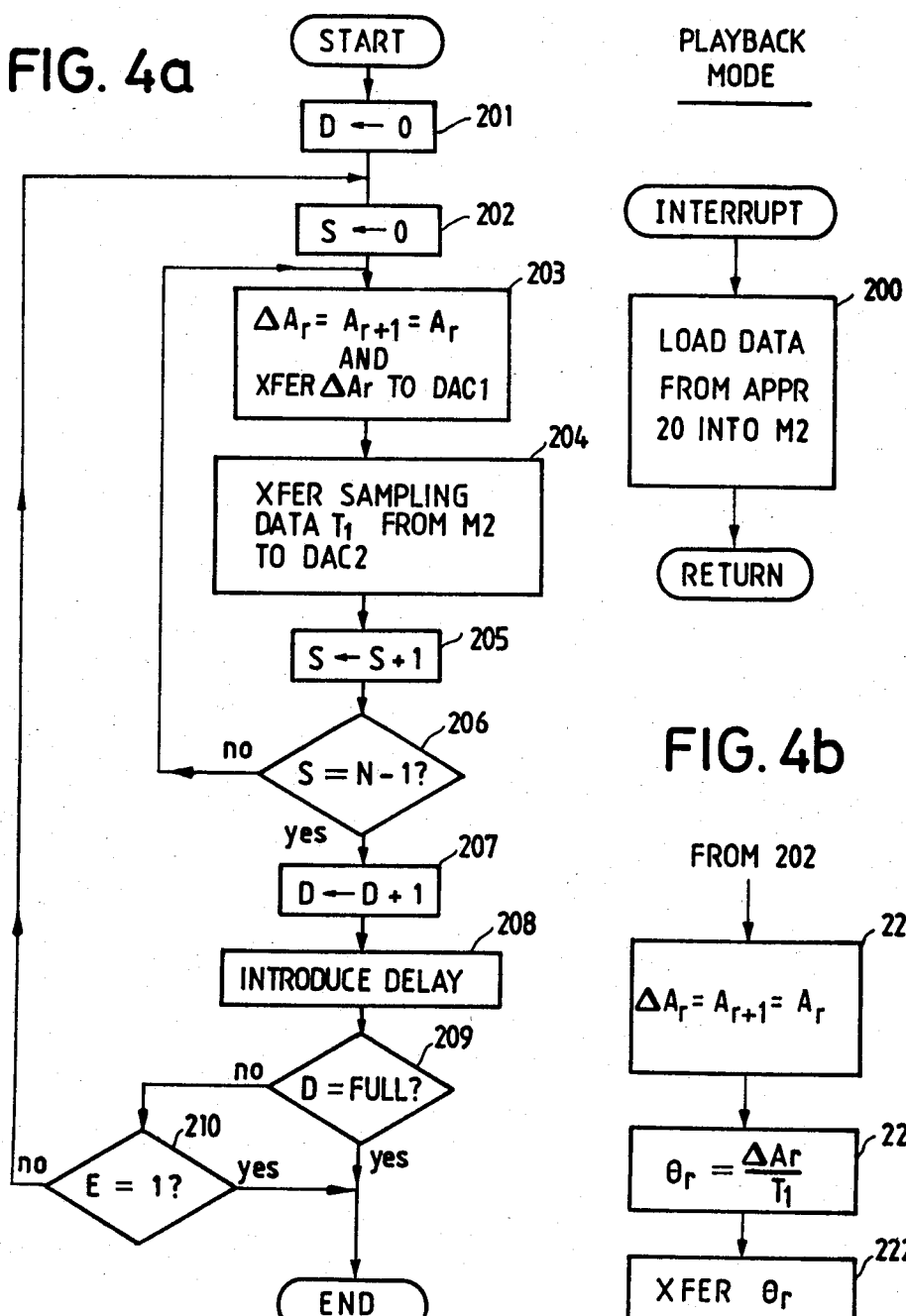
FIGS. 4a and 4b are flowcharts of instruction steps which the microcomputer executes when the system is operating in a playback mode.

Alternatively, the flowchart of FIG. 4a is modified as shown in FIG. 4b in which the blocks 203 and 204 of FIG. 4a are replaced with blocks 220, 221 and 222. In block 220, the microcomputer reads the digital sample $A_r$ and derives the amplitude difference $\Delta A_r$ and proceeds to block 221 to divide $\Delta A_r$ by sampling datum $T_1$ to obtain gradient $\theta_r$. In block 222, the gradient datum is transferred to the converter DAC1. In this modification, the DA converter DAC2 and the divider 6a of FIG. 5 are dispensed with and the output of DAC1 is directly connected to the input of the integrator 6b.

According to the sampling theorem, quantum noise occurs if the one-half value of the sampling frequency is lower than the frequency range of the information signal. The data reduction system of the first embodiment, however, is not satisfactory in cases where the zero crosspoints are spaced at such long intervals that the one-half value of the sampling frequency may become lower than the cut-off frequency of the low-pass filter 7.

Figure 7A:
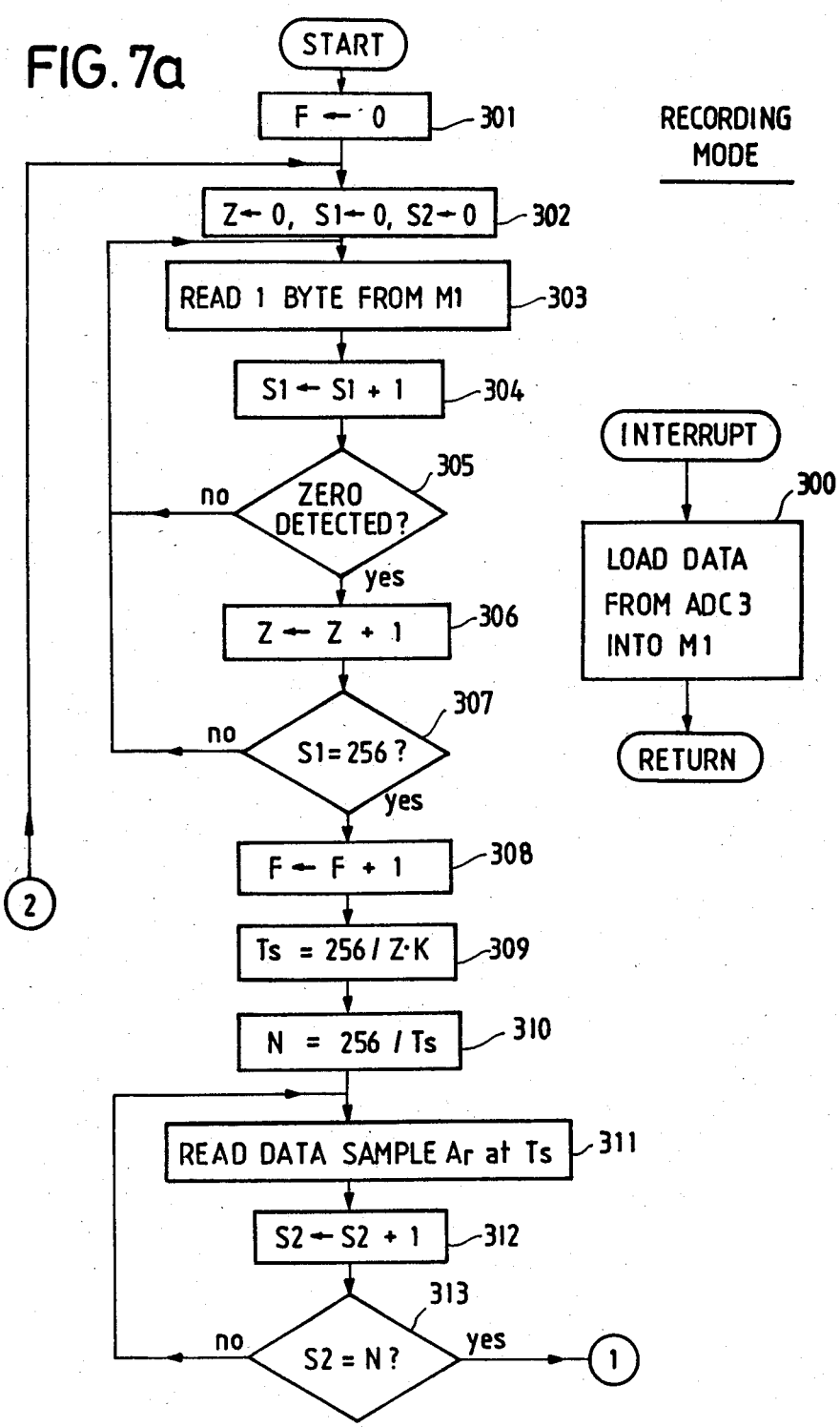
FIGS. 7a and 7b are a flowchart of a second embodiment of the invention describing instruction steps to be executed by the microcomputer operating in a recording mode.
Figure 7B:
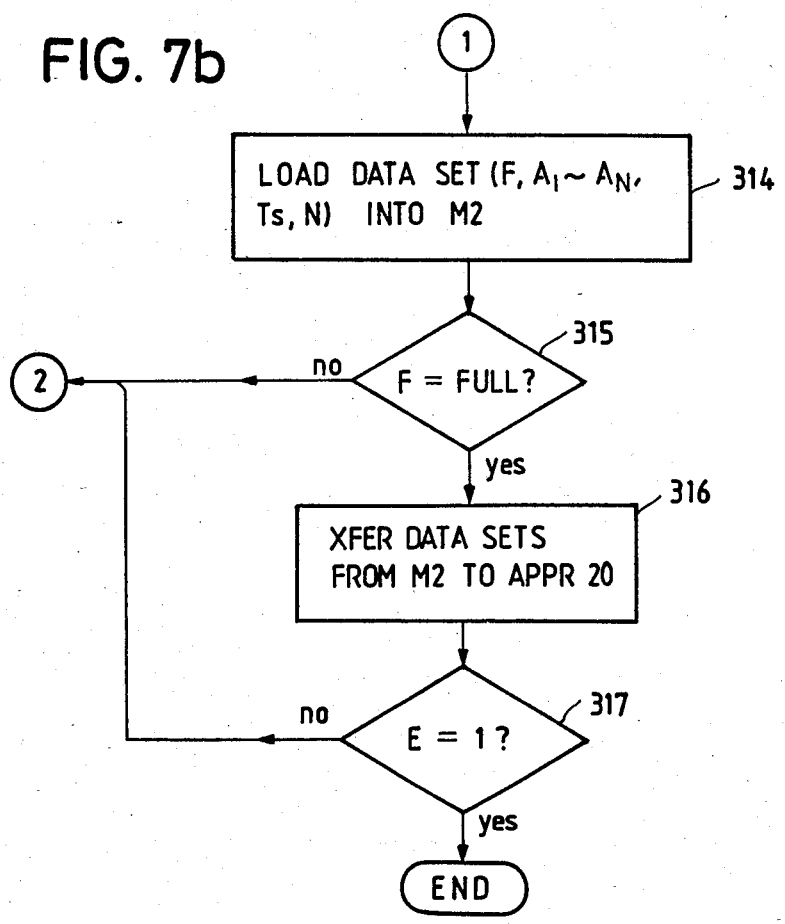

FIGS. 7a and 7b are illustrations of a flowchart describing the instructions of the microcomputer 10 programmed according to a second embodiment of the invention which eliminates the shortcoming of the first embodiment.

When the manual switch R is operated, the program begins with a block 301 by resetting a frame counter F to zero. In block 302, the microcomputer resets other counters to zero including a zero-crossing counter Z, a 256-byte sampling counter S1 for counting the number of digital samples forming a frame to be described later, and a second sampling counter S2 for counting the number of digital samples to be transferred from the buffer memory M1 to the read-write memory M2. The zero-crossing counter Z is used to register the number of zero crossover points that occur within the frame interval. The frame counter F serves to count the number of frames that have been formed. In block 303 one byte of digital sample is read from the buffer memory M1 into which data have been loaded from AD converter 3 in block 300 Block 303 is followed by a block 304 to increment the sampling counter S1 by "1". A zero crossover point is detected when there is a change in sign bit of the loaded 8-bit code that signifies the occurrence of a zero crossover point of the input analog signal. This zero crossover point detection is carried out in block 305. If there is no change in the sign bit, the program returns to block 303 to read the next digital sample incrementing the counter S1 by "1". This is repeated until a zero crossover point is detected in block 305. When this occurs, the zero-crossing counter Z is incremented by "1" in block 306 to advance to a block 307 to check if 256 digital samples have been read from the memory M1, and if not, the program returns to block 303 again to repeat the above process until full count (=256) is reached in the sampling counter S1. The frame counter F is incremented by "1" in block 308.

Figure 8:
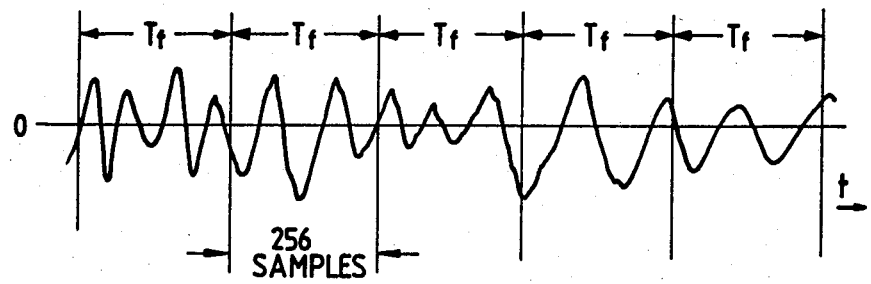
FIG. 8 is a waveform diagram associated with the second embodiment.

The fact that the sampling counter S1 is filled to its full count is an index that defines a "frame" $T_f$ as shown in FIG. 8. The count value of the zero crossing counter Z up to this moment is an indication of the number of zero crossover points of the input signal that occur in that frame interval.

According to the second embodiment of the invention, a sampling interval Ts is determined for each frame interval for purposes of transferring N digital samples from the buffer memory M1 to the memory M2. This is done by dividing the number of sampling points (=256) by the number of detected zero crossover points Z which is multiplied by a factor K (where, K is an integer), as stated in block 309. A datum N signifying the number of digital samples to be loaded into the memory M2 is determined in block 310 by dividing 256 by Ts.

Using an address determined by Ts, the microcomputer proceeds to read a digital sample $A_r$ (where r=1, 2, ... N) from memory M1 and the second sampling counter S2 is incremented by "1". These operations are carried out in blocks 311 and 312. In block 313, the contents of counter S2 are checked if it corresponds to N, and if not, the program returns to block 311 to read the next digital sample $A_{r+1}$, further incrementing the counter S2 in block 312 until S2=N is detected in block 313, whereby digital samples $A_1$ to $A_N$ are read out of the memory M1. Digital samples $A_1$ to $A_N$ and data F, Ts and N are combined in block 314 to form a data set ($A_1$-$A_N$, F, Ts, N) and stored in the read-write memory M2. When full count is reached in the frame counter F (see block 315), the data stored in memory M2 is transferred at periodic intervals to the external memory or recording system 20, block 316. If full count is not yet reached in the counter F, the program returns to block 302 to repeat the above process in respect of the digital samples which form the next frame and enters a block 317 to check if stop switch E is operated to terminate the recording mode.

If it is assumed that K=2, Z=32 and the frame interval is 32 milliseconds, Ts will be 256/(32×2)=4 clock intervals which equals 0.5 milliseconds (=4/8000) and therefore the number of data samples of each frame is reduced from 256 to 64. If use is made of a low-pass filter having a cut-off frequency of 750 Hz, there will be no noise in the reproduced signal. If the data F, N and Ts are respectively assigned 2, 1 and 64 bytes and the average number of data samples contained in the frame interval is 32, 68 bytes of information will be required for each frame and the 64K-byte read-write memory M2 will be able to store a 30-second duration of voiced information.

Figure 9:
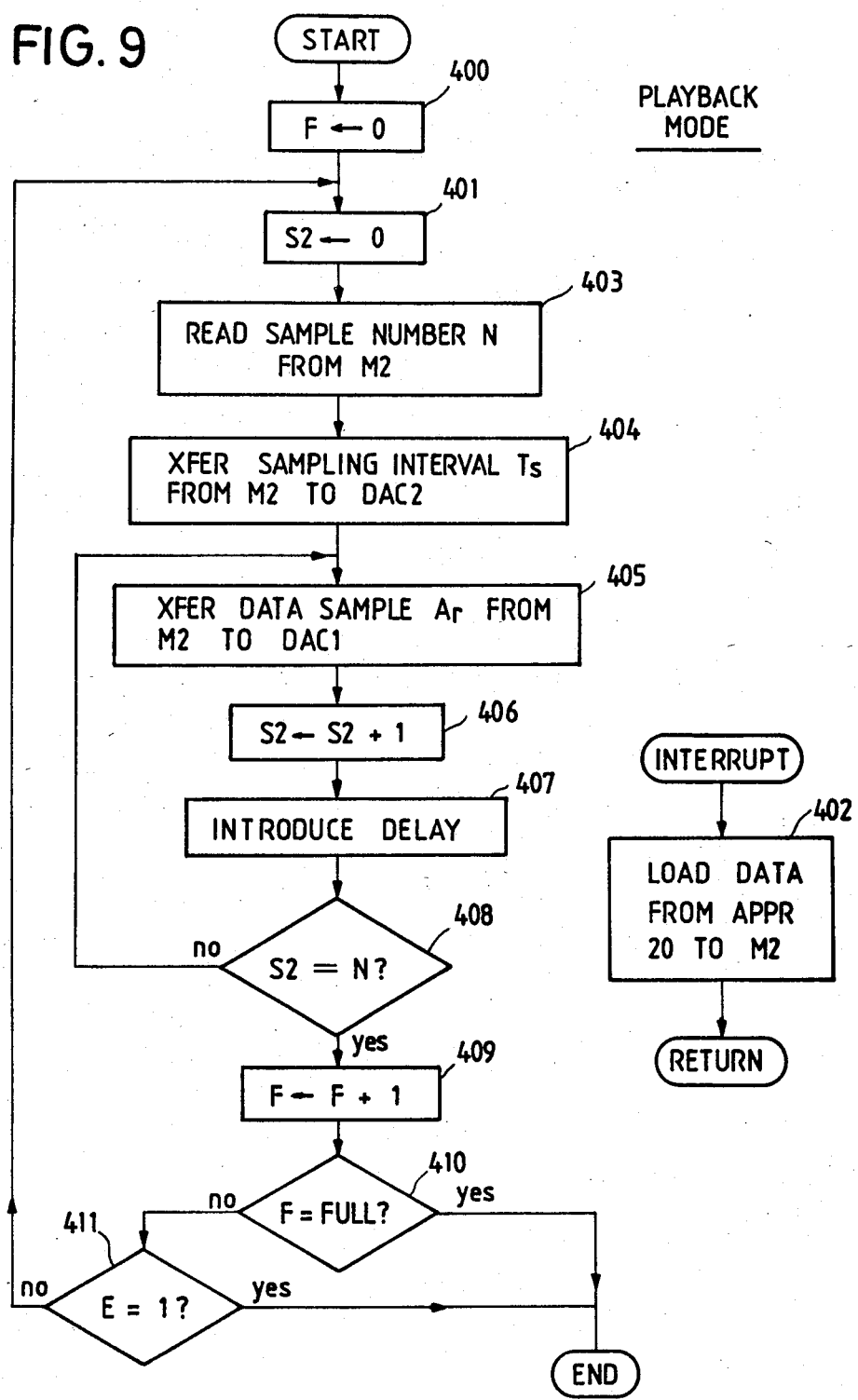
FIG. 9 is a flowchart describing instructions to be executed according to the second embodiment by the microcomputer when operating in a playback mode.

Referring to FIG. 9, playback mode is initiated in response to the operation of switch P, causing the microcomputer 10 to execute the statements in blocks 400 and 401 by resetting the frame counter F and sampling counter S2 to zero. Input data is loaded from apparatus 20 into memory M2 at clock intervals by an interrupt routine 402. The sample number datum N of a given data set is read from the memory M2 in block 403 and the sampling interval datum Ts of the data set is transferred from memory M2 to the DA converter DAC2 (block 404). A digital sample Ar of the data set is transferred from memory M2 to the DA converter DAC1 (block 405). The sampling counter S2 is incremented by "1" in block 406 after each digital sample is transferred to the DA converter DAC1. A delay time is introduced in block 407 so that the time involved in processing the blocks 405 to 408 corresponds to the sampling interval Ts. In block 408, the count value of the sampling counter S2 is checked if it corresponds to N, and if not, the program returns to block 405 to transfer the next digital sample Ar+1 of the given data set to converter DAC1. Therefore, digital samples $A_1$ to $A_N$ of the given data set are transferred to the converter DAC1 during each frame interval. The frame counter F is incremented by "1" in block 409. The program goes through blocks 410 and 411 and returns to block 401 to reset the sampling counter to zero to repeat the above process until the frame counter F is filled to full count or switch E is operated.

Figure 10:
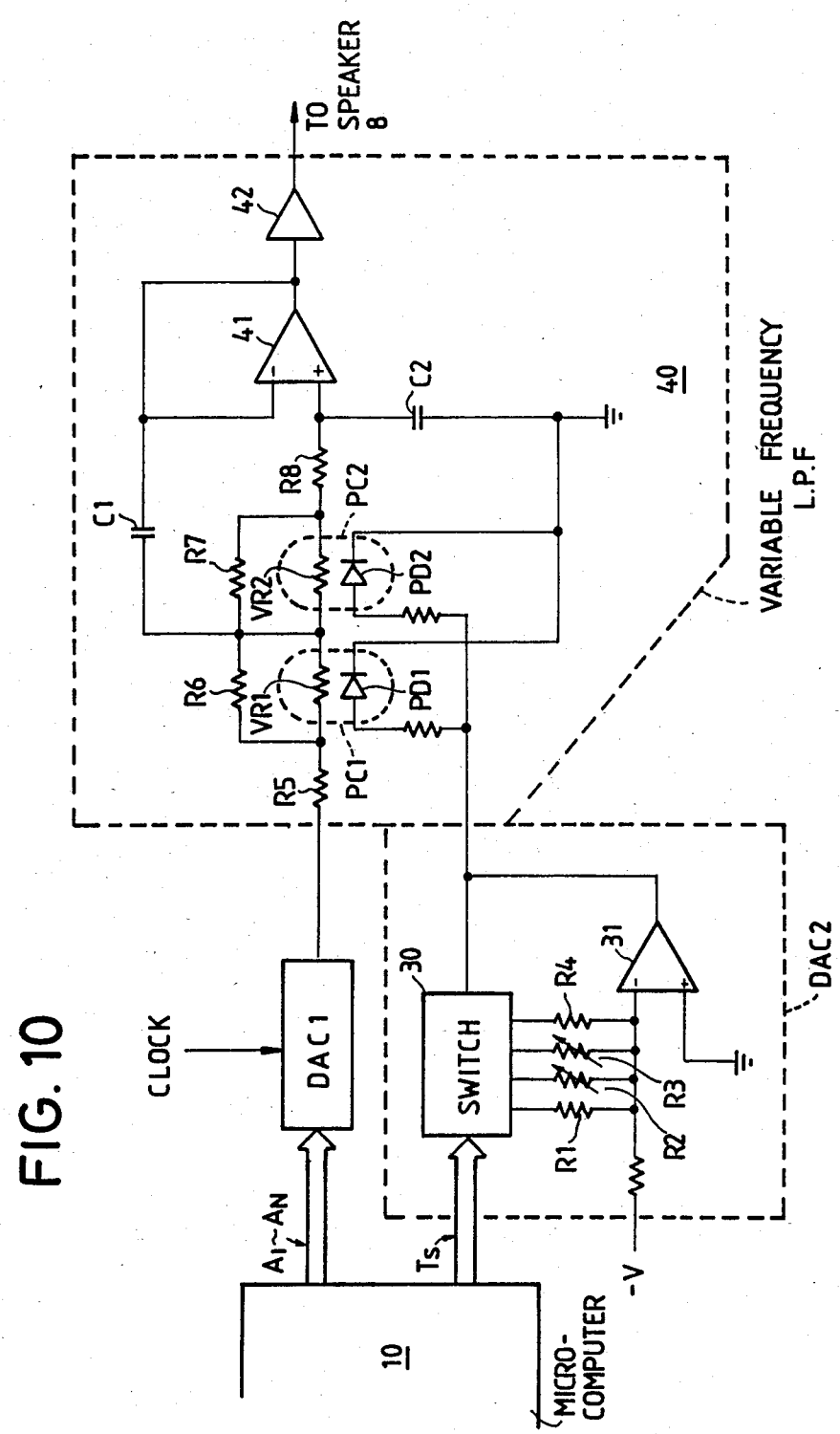
FIG. 10 is a circuit diagram of the detail of the digital-to-analog converter of FIG. 1 and a variable frequency low-pass filter constructed according to the second embodiment.

FIG. 10 is an illustration of the detail of the DA converter DAC2 and a variable frequency low-pass filter according to the second embodiment of the invention. The DA converter DAC2 comprises an analog switch 30, an operational amplifier 31 and a plurality of feedback resistors R1, R2, R3 and R4. The analog switch 30 is responsive to the sampling interval data Ts to selectively couple one or more resistors between the inverting input and output terminals of the amplifier 31, so that the latter has a variable gain according to the sampling interval data. The variable frequency low-pass filter 40 comprises a pair of photocouplers PC1 and PC2 having their variable resistance elements VR1, VR2 connected in series between the output of the DA converter DAC1 and the noninverting input of an operational amplifier 41 through high-frequency determining resistors R5 and R8, the inverting input of which is coupled by a capacitor C1 to a junction between low-frequency determining resistors R6 and R7. A capacitor C2 is coupled between the noninverting input of amplifier 41 to ground. Capacitors C1 and C2 are also used to determine the cut-off frequencies of the low-pass filter 40. The output of amplifier 41 is amplified at 42 and fed to the loudspeaker 8. The photodiode elements PD1 and PD2 of the photocouplers are connected from the output of amplifier 31 to ground.

The resistors R2 and R3 are variable resistors which are adjusted so that the cut-off frequency of the low-pass filter 40 may correspond to the sampling interval. As a function of the digital value Ts, the amplifier 31 provides a variable impedance to the photodiodes PD1 and PD2. The variable resistors VR1 and VR2 vary their impedance values in response to the varying brightness of the photodiodes PD1, PD2 so that the following relationships are established between sampling clock interval Ts, sampling frequency fs and the cut-off frequency fc of the filter 40:

| Ts | fs (kHz) | fc (kHz) |
|----|----------|----------|
| 1  | 8        | 3        |
| 2  | 4        | 1.5      |
| 4  | 2        | 0.75     |
| 8  | 1        | 0.375    |

It is seen that the cut-off frequency of the filter 40 becomes automatically equal to the one-half value of the varying sampling frequency, and therefore, no quantum noise occurs in the signal applied to the loudspeaker 8.

Figure 11B:
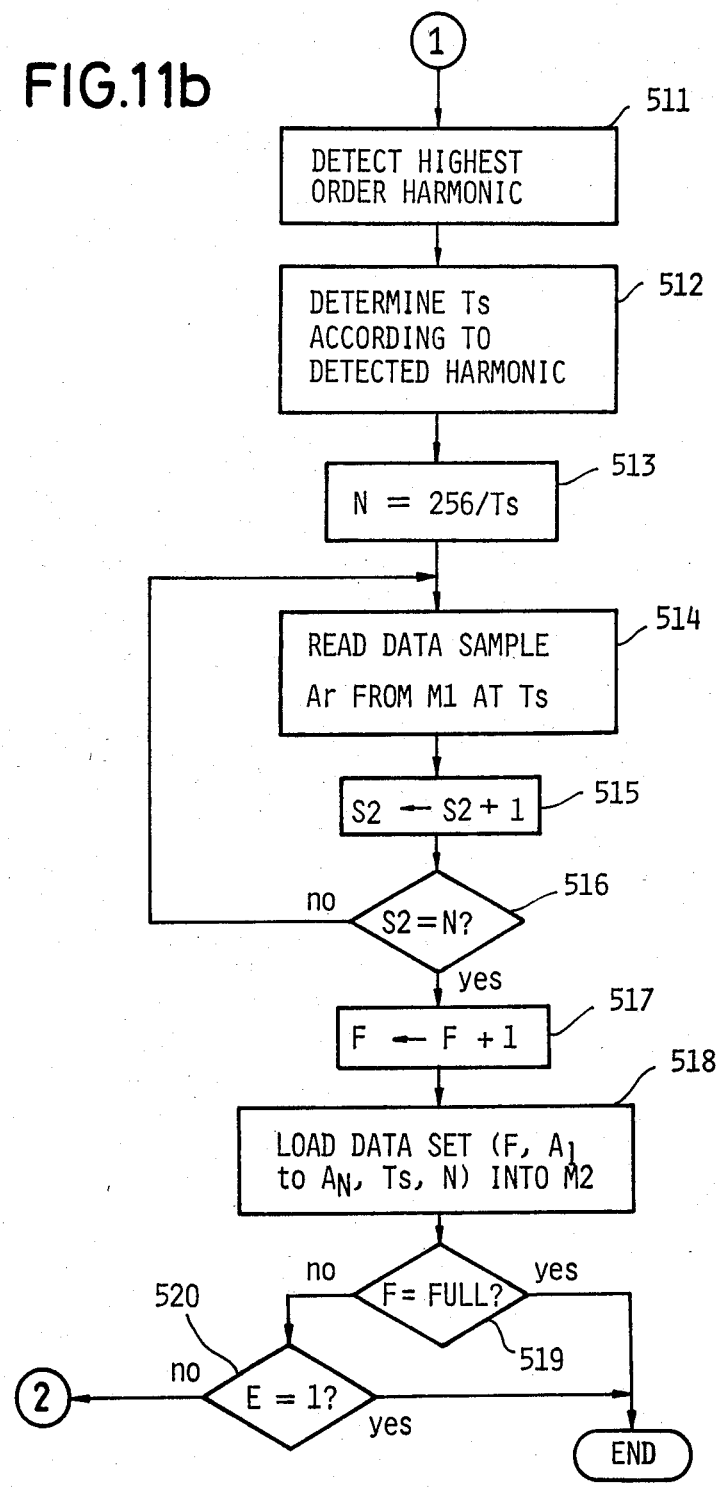

FIGS. 11a and 11b are a flowchart describing an alternative form of the recording mode of the second embodiment. Shown at 500 is an interrupt subroutine by which digital samples are loaded from the AD converter 3 to the memory M1 at clock intervals ts. The program starts with a block 501 in which the frame counter F is reset to zero. Subsequently, the sampling counters S1 and S2 are reset to zero in block 502. A digital sample is read from the memory M1 in block 503 and the first sampling counter S1 is incremented by "1" in block 504. Blocks 505 to 509 describe steps for detecting the number of harmonic components of the digital samples that occur within a frame interval. A technique known as "Fast Fourier Transform" is used for this purpose. While this technique may be used to detect a frequency spectrum of such digital samples and generate therefrom a power spectrum by simultaneously treating them in a single subroutine, it is preferable that the digital samples of each frame be divided into eight groups of 32 samples each and the FFT technique be applied in respect to each sample group. For this reason, a decision step is provided in block 505 to check if the counter S1 has reached a count of 32, and if so, the program is advanced to block 506 to use the FFT to derive a frequency spectrum from the group of 32 digital samples just read out of the memory M1 and if not the program execution returns to block 503. A power spectrum is subsequently derived in block 507 from the frequency spectrum. The blocks 503 to 507 are repeatedly executed until power spectrums are derived respectively from eight groups of 32 digital samples when S1=256 is detected in a decision step in block 508.

In block 509 the microcomputer derives a peak or average value of the power spectrum from the power spectrums of the individual groups and advances to block 510 to remove unwanted higher frequency components having spectral values lower than (1/64)th, for example, of the detected peak or average value. In block 511, the highest order of harmonic components of the power spectrum is detected by checking the power spectrum of which the unwanted components have been removed. This harmonic order value is used in block 512 to determine a corresponding sampling interval Ts from the following relationships:

| Highest Harmonic | Sampling Frequency (kHz) | Sampling Clock Interval Ts |
|------------------|--------------------------|----------------------------|
| 16–9             | 8                        | 1                          |
| 8–6              | 4                        | 2                          |
| 5                | 2.5                      | 3                          |
| 4                | 2                        | 4                          |
| 3                | 1.5                      | 5                          |
| 2                | 1                        | 8                          |
| 1                | 0.5                      | 16                         |

In block 513, the number of digital samples to be retrieved from the memory M1 is determined by dividing 256 by Ts and the sampling number counter N is set to 256/Ts. Digital samples $A_1$ to $A_N$ are sequentially retrieved from the memory M1 by executing a program loop including blocks 514 to 516: in block 514, a digital sample $A_r$ is read out of memory M1 and in block 515, the second sampling counter S2 is incremented by "1" and in block 516, S2=N? is checked. The frame counter F is then incremented in block 517. A data set F, $A_1$ to $A_N$, Ts and N is formed in block 518 and loaded into the memory M2. The program returns through blocks 519 and 520 to block 502 to reinitialize the sampling counters to repeat the above process.

What is claimed is:

1. A system for translating an analog signal into a digital signal comprising series of digital data sets, comprising:

means for sampling the analog signal at a first clocked sampling frequency and generating therefrom a series of digital samples;

memory means for storing said digital samples; and control means for generating a sampling datum indicating a variable sampling frequency at a submultiple of said first sampling frequency as a function of an instantaneous frequency of said analog signal for selecting digital samples out of said memory means in response to said sampling datum, and forming said sampling datum and said selected digital samples into a data set;

said control means comprising a microcomputer programmed to execute the following steps:

(a) periodically reading each of the digital samples out of said memory means and counting the samples until a predetermined count value is reached;

(b) detecting zero crossovers of said analog signal which occur during the interval between successive points at which said predetermined count is reached;

(c) dividing said predetermined count value by the number of said detected zero crossovers to derive said sampling datum;

(d) dividing said predetermined count value by said sampling datum to obtain a datum indicating the number of digital samples to be selected from said memory means;

(e) reading said selected digital samples out of said memory means in response to said sampling datum;

(f) forming said selected digital samples and said sampling datum into said data set; and (g) repeating the steps (a) to (f).

2. A system for translating an analog signal into a digital signal comprising series of digital data sets, comprising:

means for sampling the analog signal at a first clocked sampling frequency and generating therefrom a series of digital samples;

memory means for storing said digital samples; and control means for generating a sampling datum indicating a variable sampling frequency at a submultiple of said first sampling frequency as a function of an instantaneous frequency of said analog signal for selecting digital samples out of said memory means in response to said sampling datum, and forming said sampling datum and said selected digital samples into a data set;

said means for performing the functions of:

(a) periodically reading each of the digital samples out of said memory means and counting the samples until a predetermined sample count is reached;

(b) deriving power spectrum data from said predetermined count of said digital samples;

(c) detecting a highest order harmonic from said power spectrum data;

(d) deriving said sampling datum as a function of the detected highest order harmonic;

(e) successively reading the digital samples out of said memory means in response to said sampling datum;

(f) forming said selected digital samples and said sampling datum into said data set; and (g) repeating the steps (a) to (f).

3. A system as claimed in claim 2, further comprising:

first and second digital-to-analog converters arranged to receive the digital sample and the sampling datum of each of said data set and to provide output analog signals representative thereof;

a variable frequency low-pass filter means for passing the output of said first digital-to-analog converter to electroacoustical transducer means and having a cut-off frequency varible as a function of the output of said second digital-to-analog converter so that the cut-off frequency decreases from a predetermined frequency value by an amount corresponding to a difference between a sampling rate at which said analog signal is sampled and a reading rate at which said selected digital samples are to be read out of said memory means.

4. A system for translating an analog signal into a digital signal comprising series of digital data sets, comprising:

means for sampling the analog signal at a first clocked sampling frequency and generating therefrom a series of digital samples;

memory means for storing said digital samples; and control means for generating a sampling datum indicating a variable sampling frequency at a submultiple of said first sampling frequency as a function of an instantaneous frequency of said analog signal for selecting digital samples from said memory means, reading the selected digital samples out of said memory means in response to said sampling datum, and forming said sampling datum and said selected digital samples into a data set, further comprising second memory means and wherein said control means comprises a microcomputer programmed to execute the following steps:

(a) successively reading said digital samples out of said memory means;

(b) detecting a digital sample corresponding to a zero crossover of said analog signal and deriving a value indicated of the interval between successive zero crossovers;

(c) dividing the interval indicative value by a predetermined number to derive an address code as said sampling datum to indicate the length of time from the detecting zero crossover;

(d) addressing a said digital sample in response to said address code;

(e) forming said data set of said address code and said addressed digital sample and storing the data set into second memory means; and (f) repeating the steps (a) to (e), further comprising:

first and second digital-to-analog converters arranged to receive the digital sample and the sampling datum of each of said data set and to provide output analog signals representative thereof;

a divider means for arithmetically dividing a difference between said successive analog outputs of said first digital-to-analog converter to generate an output slope signal; and an integrator means for integrating the output slope signal of said divider and generating an output signal for application to electroacoustic transducer means.

5. A system as claimed in claim 4, wherein said microcomputer is further programmed to execute the steps of storing the data sets into said second memory means for transfer to an external memory to said system when said system is in a recording mode and reading the data sets out of said external memory into said second memory means when the system is in a playback mode.

6. A system for translating an analog signal into a digital signal comprising series of digital data sets, comprising:
   means for sampling the analog signal at a first clocked sampling frequency and generating therefrom a series of digital samples;
   memory means for storing said digital samples; and
   control means for generating a sampling datum indicating a variable sampling frequency at a submultiple of said first sampling frequency as a function of an instantaneous frequency of said analog signal for selecting digital samples from said memory means, reading the selected digital samples out of said memory means in response to said sampling datum, and forming said sampling datum and said selected digital samples into a data set,
   further comprising second memory means and wherein said control means comprises a microcomputer programmed to execute the following steps:
   (a) successively reading said digital samples out of said memory means;
   (b) detecting a digital sample corresponding to a zero crossover of said analog signal and deriving a value indicated of the interval between successive zero crossovers;
   (c) dividing the interval indicative value by a predetermined number to derive an address code as said sampling datum to indicate the length of time from the detecting zero crossover;
   (d) addressing a said digital sample in response to said address code;
   (e) forming said data set of said address code and said addressed digital sample and storing the data set into second memory means; and
   (f) repeating the steps (a) to (e),
   wherein said microcomputer is programmed to execute the step of arithmetically dividing a difference between the digital values of successive digital samples by a digital value corresponding to the address code associated therewith to generate a digital signal representing the quotient of the division, further comprising:
   a digital-to-analog converter responsive to said quotient representing digital signal providing an analog output slope signal representative thereof; and
   means for integrating the output slope signal of said digital-to-analog converter to generate an output for application to an electroacoustical transducer means.

7. A system as claimed in claim 6, further comprising:
   first and second digital-to-analog converters arranged to receive the digital sample and the sampling datum of each of said data set and to provide output analog signals representative thereof;
   a variable frequency low-pass filter means for passing the output of said first digital-to-analog converter to electroacoustical transducer means and having a cut-off frequency variable as a function of the output of said second digital-to-analog converter so that the cut-off frequency decreases from a predetermined frequency value by an amount corresponding to a difference between a sampling rate at which said analog signal is sampled and a reading rate at which said selected digital samples are to be read out of said memory means.

8. A system as claimed in claim 7, further comprising second memory means, wherein said microcomputer is further programmed to execute the steps of storing the data sets into said second memory means for transfer to an external memory to said system when said system is in a recording mode and reading the data sets out of said external memory into said second memory means when the system is in a playback mode.

9. A system as claimed in claim 6, wherein said microcomputer is further programmed to execute the steps of storing the data sets into said second memory means for transfer to an external memory to said system when said system is in a recording mode and reading the data sets out of said external memory into said second memory means when the system is in a playback mode.

10. A method for translating an analog signal into a digital signal represented by a plurality of data sets, comprising:
    (a) sampling said analog signal at clock intervals to generate analog samples, converting the analog samples into digital samples and storing the digital samples into a memory;
    (b) sequentially addressing the stored digital samples, detecting successive digital samples corresponding to the analog samples at or near zero crosspoints of the original analog signal from the addressed digital samples and detecting the zero-crossing interval between the successive zero-crosspoint digital samples;
    (c) deriving an integral multiple of said clock interval from the detected zero-crossing interval and generating a sampling code identifying a sampling interval for representing said integral multiple;
    (d) retrieving the stored digital samples at said integral multiple of said clock intervals; and
    (e) forming the retrieved digital sample and said sampling code into a data set.

11. A method as claimed in claim 10, wherein said analog signal is in audio frequency range.

12. A method for translating an analog signal into a digital signal represented by a plurality of data sets, comprising:
    (a) sampling said analog signal at clock intervals to generate analog samples, converting the analog samples into digital samples and storing the digital samples into a memory;
    (b) sequentially addressing the stored digital samples, detecting successive digital samples corresponding to the analog samples at or near zero crosspoints of the original analog signal from the addressed digital samples and detecting the zero-crossing interval between the successive zero-crosspoint digital samples;
    (c) deriving an integral multiple of said clock interval from the detected zero-crossing interval and generating a sampling code identifying a sampling interval for representing said integral multiple;
    (d) retrieving the stored digital samples at said integral multiple of said clock intervals; and
    (e) forming the retrieved digital sample and said sampling code into a data set,
    further comprising:

detecting a difference between the digital samples of the successive data sets;

dividing said difference by the sampling code of the data set to generate a digital slope signal;

converting the digital slope signal to an analog slope signal; and integrating said analog slope signal to generate a replica of the original analog signal.

13. A method for translating an analog signal into a digital signal represented by a plurality of data sets, comprising:

(a) sampling said analog signal at clock intervals to generate analog samples, converting the analog samples into digital samples and storing the digital samples into a memory;

(b) sequentially addressing the stored digital samples, detecting successive digital samples corresponding to the analog samples at or near zero crosspoints of the original analog signal from the addressed digital samples and detecting the zero-crossing interval between the successive zero-crosspoint digital samples;

(c) deriving an integral multiple of said clock interval from the detected zero-crossing interval and generating a sampling code identifying a sampling interval for representing said integral multiple;

(d) retrieving the stored digital samples at said integral multiple of said clock intervals; and (e) forming the retrieved digital sample and said sampling code into a data set, further comprising:

detecting a difference between the digital samples of the successive data sets;

converting said digital difference to the difference of an analog quantity;

converting the sampling code of the data set into an analog value;

dividing the difference of analog quantity by said analog sampling value; and integrating the divided analog quantity to generate a replica of the original analog signal.

14. A method for translating an analog signal into a digital signal represented by a plurality of data sets, comprising:

(a) sampling said analog signal at clock intervals to generate analog samples, converting the analog samples into digital samples and storing the digital samples into a memory;

(b) periodically addressing a predetermined number of the stored digital samples, detecting the digital samples corresponding to the analog samples at or near zero crosspoints of the original analog signal from the addressed digital samples and counting the detected zero-crosspoint digital samples;

(c) dividing said predetermined number by the count of said zero-crosspoint digital samples to derive an integral multiple of the clock intervals and generating a sampling code representing the integral multiple of the clock intervals;

(d) dividing said predetermined number by said sampling code to determine the number of digital samples to be selected from among the addressed digital samples;

(e) retrieving the digital samples at said integral multiple of the clock intervals from the memory; and (f) forming the retrieved digital sample and said sampling code into a data set.

15. A method as claimed in claim 14, wherein the step (d) comprises generating a sample number code indicating the number of digital samples to be selected and the step (f) comprises adding said sample number code to said data set.

16. A method as claimed in claim 14, further comprising the steps of:

converting the digital samples of said data set into analog samples;

removing components of said analog samples having frequencies higher than a threshold variable with said sampling code of said data set.

17. A method as claimed in claim 14, further comprising the steps of:

converting the digital samples of said data set into analog samples and applying the analog samples to a variable frequency low-pass filter to be applied to an electroacoustic transducer; and controlling cutoff frequency of said filter in accordance with the sampling code of said data set.

18. A method as claimed in claim 14, wherein said analog signal is in audio frequency range.

19. A method for translating an analog signal into a digital signal represented by a plurality of data sets, comprising:

(a) sampling said analog signal at clock intervals to generate analog samples, converting the analog samples into digital samples which include zero-crossing digital samples corresponding to the analog samples at or near zero crossings of said analog signal and storing the digital samples into a memory;

(b) periodically addressing a predetermined number of the stored digital samples at constant intervals and deriving a power spectrum from the addressed digital samples;

(c) detecting a highest order harmonic from said power spectrum;

(d) deriving an integral multiple of said clock intervals from said highest order harmonic and generating a sampling code representing said integral multiple of the clock interval;

(e) dividing said predetermined number by said integral multiple of the clock interval to determine the number of digital samples to be selected from among the addressed digital samples;

(f) retrieving the stored digital samples at said integral multiple of the clock interval; and (g) forming said retrieved digital sample and said sampling interval into a data set.

20. A method as claimed in claim 19, wherein the step (e) comprises generating a sample number code indicating the number of digital samples to be selected and the step (g) comprises adding said sample number code to said data set.

21. A method as claimed in claim 19, further comprising the steps of:

converting the digital samples of said data set into analog samples;

removing components of said analog samples having frequencies higher than a threshold variable with said sampling code of said data set.

22. A method as claimed in claim 19, further comprising the steps of:

converting the digital samples of said data set into analog samples and applying the analog samples to a variable frequency low-pass filter to be applied to an electroacoustic transducer; and controlling cutoff frequency of said filter in accordance with the sampling code of said data set.

23. A method as claimed in claim 19, wherein said analog signal is in audio frequency range.

* * * * *